(12) United States Patent
Luu

(10) Patent No.: US 6,300,829 B1
(45) Date of Patent: Oct. 9, 2001

(54) RF POWER AMPLIFIER SYSTEM HAVING INDUCTIVE STEERING

(75) Inventor: Ky Thoai Luu, Quincy, IL (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/489,488

(22) Filed: Jan. 21, 2000

(51) Int. Cl.$^7$ ................................................ H03F 3/217
(52) U.S. Cl. .................................... 330/251; 330/297
(58) Field of Search .............................. 330/10, 207 A, 330/251, 297

(56) References Cited

U.S. PATENT DOCUMENTS

| 4,580,111 | 4/1986 | Swanson | 332/41 |
| 4,949,050 | 8/1990 | Swanson | 330/298 |
| 5,612,647 | 3/1997 | Malec | 330/146 |
| 6,104,248 | * 8/2000 | Carver | 330/297 |

* cited by examiner

Primary Examiner—Steven J. Mottola

(74) *Attorney, Agent, or Firm*—Tarolli, Sundheim, Covell, Tummino & Szabo L.L.P.

(57) ABSTRACT

A RF power amplifier system is presented including a RF source for providing a train of RF pulses exhibiting RF cycles of a fixed frequency and wherein each pulse is of a fixed amplitude and duration. A bridge circuit including a first transistor switch for, when on, connecting a DC voltage source across the load for DC current flow therethrough in a first direction and a second transistor switch for, when on, connecting said DC voltage source across said load for DC current flow therethrough in a second direction. A switch driver for, when enabled, passes the RF pulses for driving the first and second transistor switches on and off at a frequency dependent upon that of the RF pulses and in such a manner that current from the DC voltage source alternately flows in the first and second directions through the load. A driver controller provides turn-on signals and selectively applies them to the switch driver for enabling the switch driver for passing the RF pulses to the transistor switches. The switch driver includes first and second logic gates respectively connected to the first and second transistor switches. First and second inductive steering circuits are respectively interposed between the first logic gate and the first transistor switch and the second logic gate and the second transistor switch.

72 Claims, 6 Drawing Sheets

RF POWER AMPLIFIER SYSTEM HAVING INDUCTIVE STEERING

BACKGROUND OF THE INVENTION

1. Technical Field

This invention relates to the art of AM radio broadcasting and, more particularly, to an RF power amplifier system of the type employed in AM radio broadcasting together with improved driver circuitry employing inductive steering.

2. Description of the Prior Art

The U.S. patents to H. I. Swanson U.S. Pat. Nos. 4,580,111 and 4,949,050 disclose an amplitude modulator for use in AM radio broadcasting and wherein the modulator serves to generate an amplitude modulated signal by selectively turning on and off a plurality of RF amplifiers in a digital manner to produce amplitude modulation. Each of the RF amplifiers includes a plurality of switching transistors, each of which may take the form of a MOSFET transistor, connected together in a bridge circuit. This bridge circuit provides output signals to an output combiner. Each of the MOSFET transistors has a gate which is driven by properly phased RF frequency signals that allow the proper MOSFET transistors to be turned on at the correct times.

The drive system for driving the RF amplifier MOSFET switching transistors includes a transformer having a secondary winding for driving each MOSFET switching transistor. This provides a low impedance source of drive for the gate of each MOSFET switching transistor. This also provides the correct out-of-phase drive to the MOSFET switching transistors. Thus, the bridge arrangement includes upper MOSFET switching transistors and lower MOSFET switching transistors. The correct out-of-phase drive to the MOSFET transistors provides the proper gate voltage with respect to the source voltage.

With the onset of digital radio operations, a direct drive operation of the switching transistors is desirable. Such a circuit has been disclosed in the U.S. patent to J.N. Malec U.S. Pat. No. 5,612,647. The present invention is directed towards improvements over those shown in the Swanson patents and the Malec patent.

An inductive steering drive circuit is located in the gate circuit of each of the MOSFET switching transistors. This permits a higher switching frequency and, in addition, eliminates the need for an RF drive tuning circuit frequently employed in amplifiers including transformers such as those disclosed in the Swanson patents referred to above.

Another feature of the present invention is directed toward a direct drive RF power amplifier system that employs a MOSFET buffer amplifier in the gate circuit of each MOSFET switching transistor and wherein the power supply for the buffer amplifiers includes a DC to DC converter operating in synchronism with the carrier frequency employed so that the DC supply voltage for the buffer amplifiers will have a DC ripple voltage which is same as the amplifier carrier frequency. This will minimize intermodulation products because the ripple frequency is locked to the carrier frequency.

Another feature of the present invention is circuitry for synchronously controlling the amplifier in such a manner to insure that the TURN ON and TURN OFF of the amplifier corresponds with the start and end of an RF cycle respectively. Such synchronous operation minimizes damage to the MOSFETs. If the switching is not synchronized, the MOSFETs can be damaged because of a high dv/dt secondary breakdown of the transistors.

SUMMARY OF THE INVENTION

The invention herein contemplates the provision of a RF power amplifier system employing an RF source for providing a train of RF pulses exhibiting RF cycles of a fixed frequency and wherein each pulse is of a fixed amplitude and duration. A bridge circuit includes a first transistor switch which, when on, connects a DC voltage source across a load for DC current flow therethrough in a first direction and a second transistor switch which, when on, connects the DC voltage source across the load for DC current flow therethrough in a second direction. A switch driver operates, when enabled, to pass the RF pulses for purposes of driving the first and second transistor switches on and off at a frequency dependant upon that of the RF pulses and in such a manner that current from the DC voltage source alternately flows in the first and second directions through the load. A driver controller provides turn on signals and selectively applies them to the switch driver for enabling the switch driver to pass the RF pulses to the transistor switches.

In accordance with the present invention, the switch driver includes first and second logic gates respectively connected to the first and second transistor switches. First and second inductive steering circuits are respectively interposed between the first logic gate and the first transistor switch and the second logic gate and the second transistor switch.

In accordance with a more limited aspect of the present invention, the driver controller includes logic circuitry responsive to an amplifier turn on control signal and the RF pulses for enabling the switch driver in such a manner that the first and second transistor switches are turned on and off in synchronism with the start of a RF cycle and the end of a RF cycle.

In accordance with another aspect of the present invention, a driver amplifier is interposed between the switch driver and each transistor switch in the bridge circuit and a DC to DC power supply is provided for supplying DC drive voltage to each of the driver amplifiers wherein the power supply includes a second DC voltage source and a transformer having a primary winding and a plurality of secondary windings together with a switching transistor which, when turned on, connects the primary winding across the second DC voltage source. The switching transistor is turned on and off in synchronism with the frequency of the RF pulses so that any DC supply ripple voltage at the secondary windings has a ripple frequency equal to that of the frequency of the RF pulses.

DESCRIPTION OF THE DRAWINGS

The foregoing and other objects and advantages of the present invention will become more readily apparent from the following description as taken in conjunction with the accompanying drawings, wherein.

DESCRIPTION OF PREFERRED EMBODIMENT

One application of the present invention is in conjunction with RF power amplifiers employed in an AM broadcast transmitter. An example of such a transmitter is presented in FIG. 1 and takes the form of a digital amplitude modulator such as that illustrated and described in the aforesaid U.S. Pat. No. 4,580,111, which is assigned to the same assignee as the present invention, the disclosure of which is herein incorporated by reference.

Figure 1:
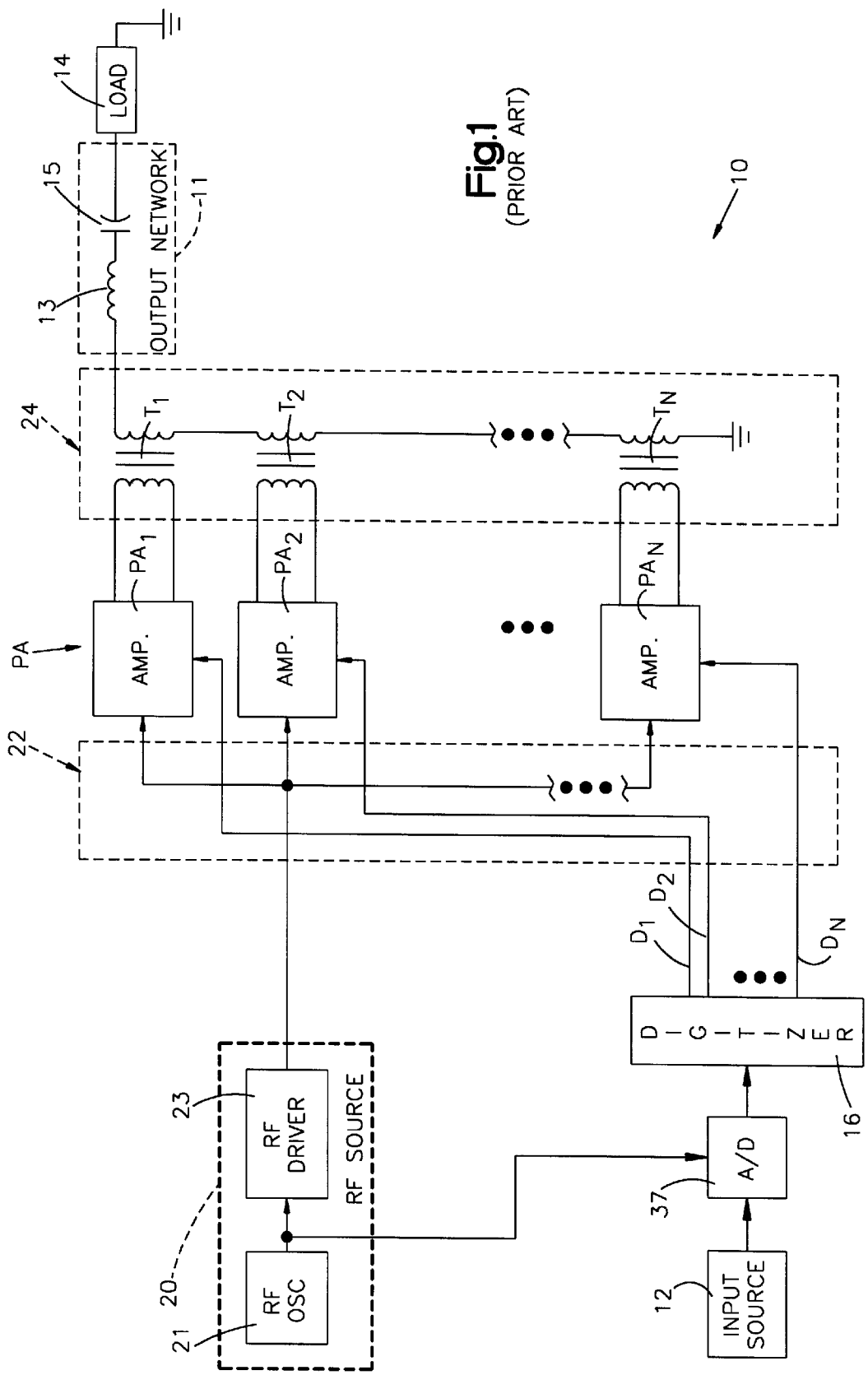
FIG. 1 is a prior art schematic-block diagram illustration of one application to which the present invention may be applied.
Figure 2:
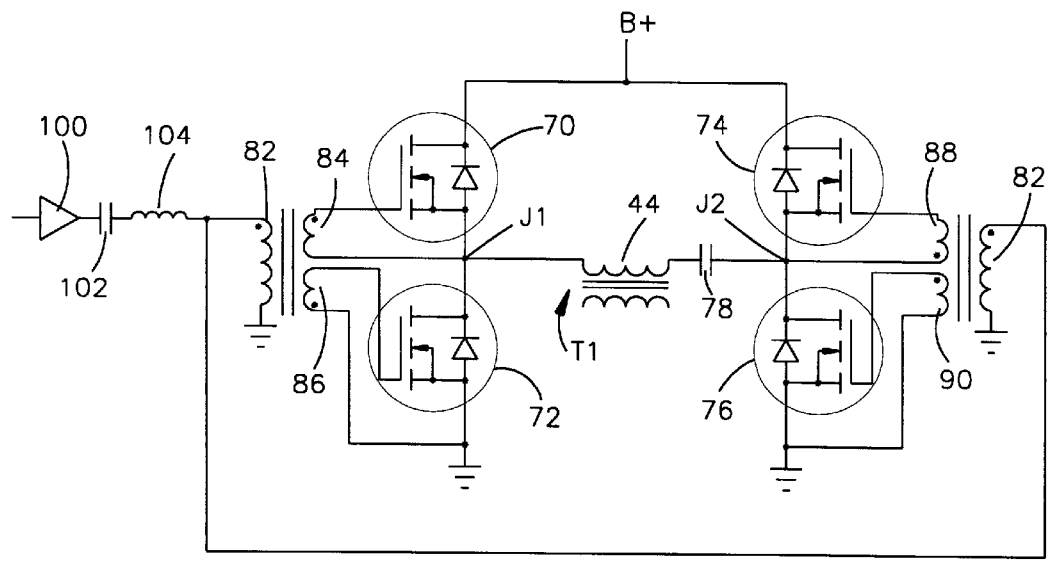
FIG. 2 is a prior art schematic-circuit illustration of one of the power amplifiers employed in FIG. 1.
Figure 3:
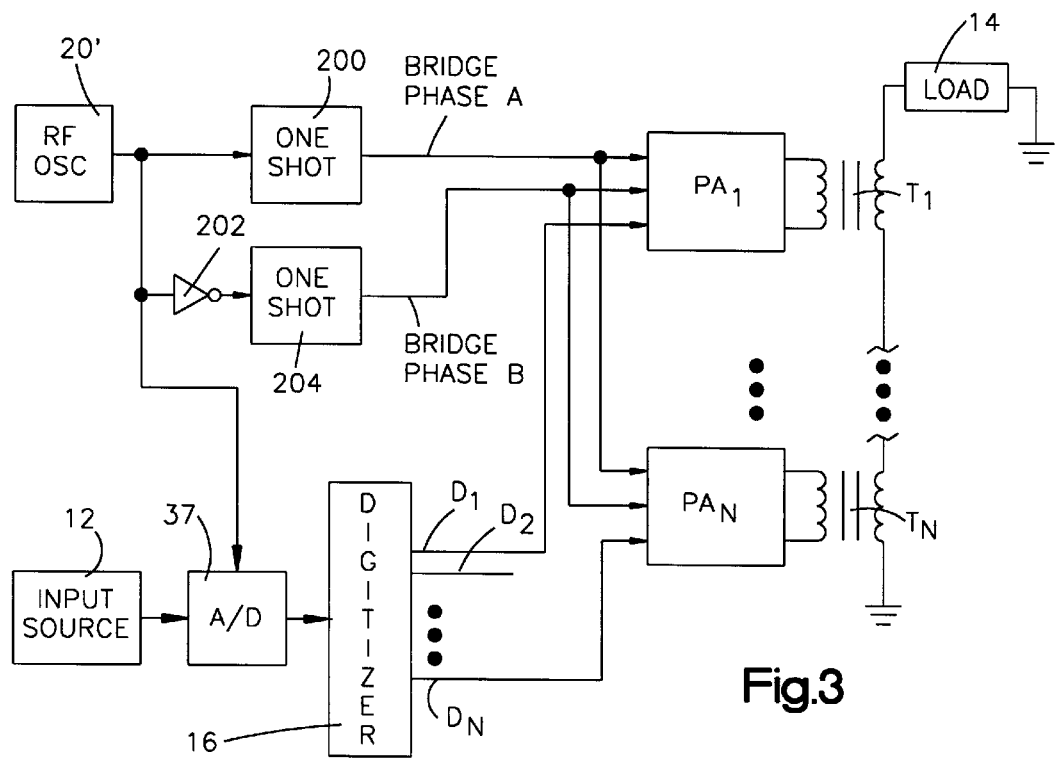
FIG. 3 is a schematic-block diagram illustration of one embodiment of the present invention.

The discussion which follows is directed to an explanation of the operation of the circuitry shown in FIG. 1 followed by a detailed description of a power amplifier as illustrated in FIG. 2 herein as background for the discussion of the invention presented with respect to the embodiment illustrated herein in FIG. 3.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided on an output line connected to a load 14, which may take the form of an RF transmitting antenna. This output line includes an output network 11 including an inductor 13 and a capacitor 15. A digitizer 16 provides a plurality of digital control signals D1 through DN. The control signals are binary signals each having a binary 1 or a binary 0 level. The number of signals having binary 1 or binary 0 levels is dependent upon the instantaneous level of the input signal.

Each of the output control signals D1–DN is supplied to one of a plurality of N RF power amplifiers $PA_1$–$PA_N$. The control signals serve to turn associated power amplifiers either on or off. Thus, if the control signal has a binary 0 level, then its associated amplifier is inactive and no signal is provided at its output. However, if the control signal is of a binary 1 level, then the power amplifier is active and an amplified carrier signal is provided at its output. Each power amplifier has an input connected to a single common RF source 20. The RF source 20 serves as the single source of an RF carrier signal which is supplied by way of an RF splitter 22 so that each amplifier $PA_1$–$PA_N$ receives a signal of like amplitude and phase and frequency. The carrier signal is amplitude modulated in accordance with the control signals D1–DN and the amplitude modulated carrier signals will be of like frequency and phase. These signals are supplied to a combiner circuit 24 comprised of a plurality of transformers $T_1, T_2, \ldots, T_N$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

As is conventional in such a system, the RF source 20 includes an RF oscillator 21 having a frequency on the order of 60 to 1600 KHz. This oscillator feeds an RF driver 23, the output of which is supplied to the power amplifiers $PA_1$–$PA_N$. The RF driver provides power amplification of the RF signal obtained from oscillator 21 prior to the signal being supplied to the power amplifiers at which modulation also takes place. The RF driver 23 may include several stages of amplification and may be configured similar to the power amplifiers $PA_1$–$PA_N$.

FIG. 2 illustrates one form which the power amplifier $PA_1$ of FIG. 1 may take, the other power amplifiers $PA_2$–$PA_N$ being similar. The power amplifier illustrated includes four MOSFET switching transistors 70, 72, 74 and 76 connected together in a bridge arrangement across a DC power supply voltage B+, which may have a magnitude on the order of 250 volts. The primary winding 44 of an associated transformer T1 is connected across the bridge junctions J1 and J2.

More particularly, the semiconductor amplifier elements are metal oxide semiconductor, field effect transistors (MOSFETs) having three electrodes, conventionally identified as the gate, drain, and source. The drain-source paths of the transistors 70 and 72, representing their primary current paths, are connected in series across the DC power supply, as are the drain-source current paths of transistors 74 and 76. The primary winding 44 of the corresponding combiner transformer T1 is connected in series with a DC blocking capacitor 78 across the common junctions $J_1$ and $J_2$ between transistors 70 and 72 and transistors 74 and 76.

The transistors 70, 72, 74 and 76 effectively operate as switches to connect the two sides of the primary winding 44 to either the DC voltage source or to ground. By proper operation of these transistors, the transformer winding 44 can be connected in either direction across the DC power supply.

Referring back to FIG. 2, the transistor switches 70, 72, 74 and 76 are controlled by signals applied to their gate electrodes. The gate signals for all four transistors are derived from individual secondary transformer windings. This transformer has a toroidal ferrite core with a primary winding 82 and four secondary windings 84, 86, 88 and 90 wound around it. The turns ratio of the transformer is 1:1, whereby the same signal appearing at the primary is applied to each of the circuits connected to the four secondary windings.

Each of the four secondary windings is connected between the gate and source electrodes of an associated one of the MOSFETs 70–76. The secondary 84 is directly connected between the gate of MOSFET 70 and junction $J_1$, while secondary 88 is similarly directly connected between the gate of MOSFET 74 and junction $J_2$. The secondary windings 86 and 90 are in like manner connected between the gate and source electrodes of MOSFETs 72 and 76.

The primary winding 82 of the toroidal transformer is connected to the output of the RF source 20, which provides a sinusoidal RF driving voltage to the power amplifier. Each MOSFET turns "on" when the RF signal applied to its gate is on its positive half cycle and "off" when the applied signal is on its negative half cycle. The MOSFETs therefore cyclically turn on and off at a frequency and phase of the applied RF gate signal. The windings 84 and 90 are connected across MOSFETs 70 and 76 in similar directions whereby the signals appearing at the gates of these transistors are in phase with one another. MOSFETs 70 and 76 therefore turn on and off in unison. Windings 86 and 88, on the other hand, are connected across MOSFETs 72 and 74 in a direction opposite to the direction of connection of the windings 84 and 90. The signals applied to the gates of MOSFETs 70 and 76 are therefore 180° out of phase with respect to the signals applied to the gates of transistors 74 and 72. Consequently, when transistors 70 and 76 are "on", transistors 72 and 74 are "off", and vice versa.

It is seen from the discussion presented above that each of the RF power amplifiers $PA_1$ through $PA_N$ requires a transformer having a secondary winding associated with the gate of each MOSFET transistor. Thus, as is seen in FIG. 2, the secondary windings 84, 86, 88, and 90 provide the sinusoidal RF driving voltage to the gate electrodes of the MOSFET transistor switches. The driving voltages are required to have the proper phasing so that MOSFET transistors 70 and 76 are on while transistors 72 and 74 are off and vice versa. In addition to the proper phasing of these RF signals, the RF driver 23 (see FIG. 1) includes several stages of amplification. In each of these stages there are losses in the amplifiers, tuner circuits, and coupling circuits.

In addition to the foregoing, it is to be noted that the bridge amplifier of FIG. 2 employs a buffer amplifier 100 and a tuning circuit including a capacitor 102 and an inductor 104. Drive signals are tuned and create sinusoidal drive signals which have slow rise and fall times during the transitions. Such an amplifier has a narrow bandwidth and thus requires tuning for each operating frequency. Also, the drive method shown in FIG. 2 requires a higher drive power because the signal is a bipolar level and thus the drive signal is an AC signal that swings between positive and negative levels. Such a sinusoidal drive signal results in slow dv/dt. It is difficult to switch such an RF drive on and off at a high switching rate because of the increase in switching losses due to the slow dv/dt operation from using a sinusoidal drive signal. Thus during each ON-OFF transition, the RF drive tuning circuit is de-tuned due to the dynamic loading changes which can cause unwanted phase modulation to the output of the transmitter.

Figure 9:
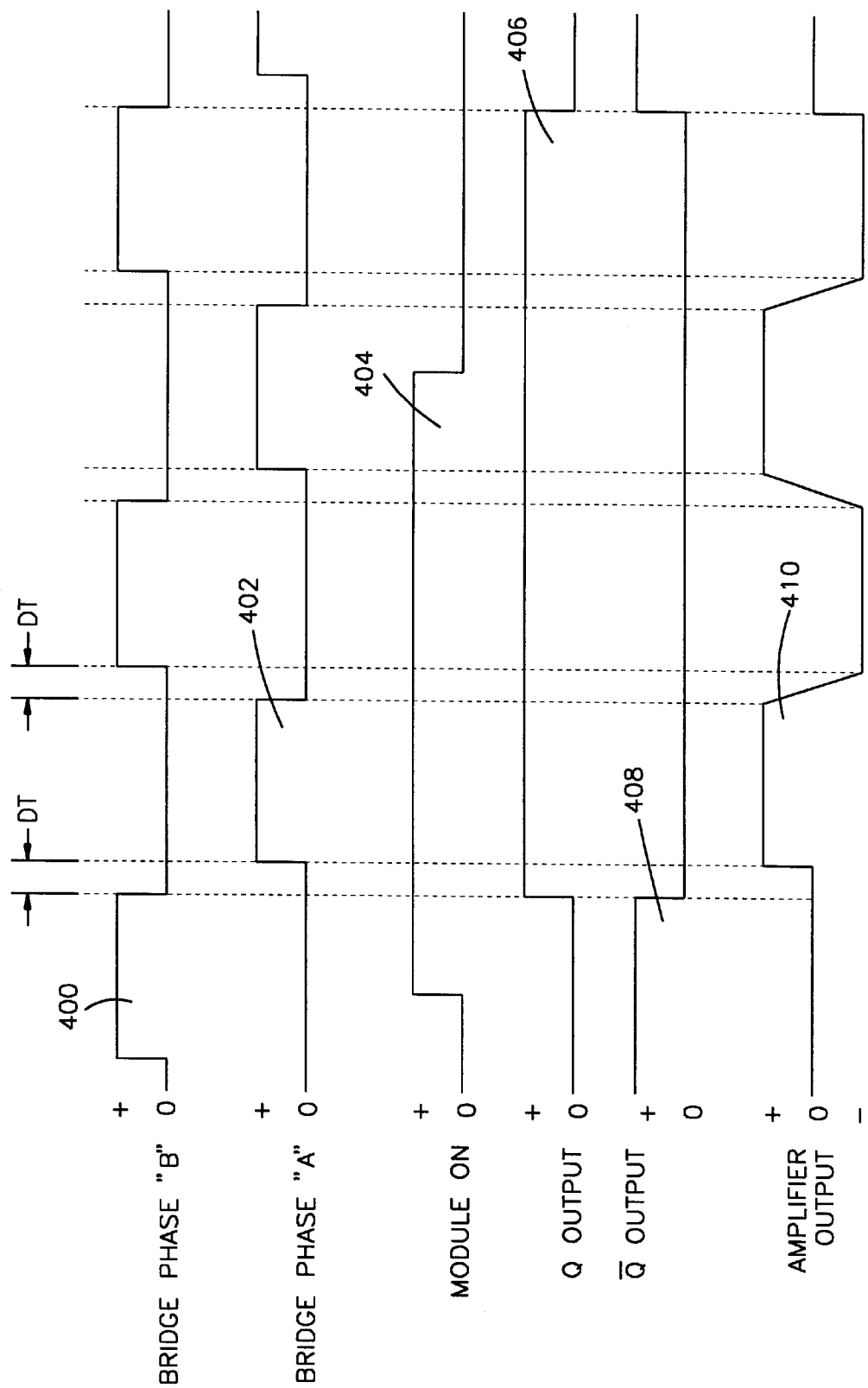

In accordance with the present invention there is provided a direct MOSFET transistor drive as will be described in detail herein with reference to FIG. 4. One application of the present invention is represented by the circuit of FIG. 3 which employs circuitry similar to that of FIG. 1 and consequently like components are identified with like character references. In this embodiment however, the RF oscillator 20' provides an RF frequency signal which is made up of a train of square wave RF pulses exhibiting RF cycles of a fixed frequency and each positive pulse being of a fixed magnitude and fixed width. The RF pulses are supplied to a pair of one shot circuits including a one shot circuit 200 and by way of an inverter 202 to a second one shot circuit 204. These provide bridge phase A and bridge phase B square wave signals or pulses to the power amplifiers $PA_1$–$PA_N$ with the bridge phase A and bridge phase B signals being 180 degrees out of phase from each other as is shown in FIG. 9 with a dead time DT between the pulses.

Figure 4:
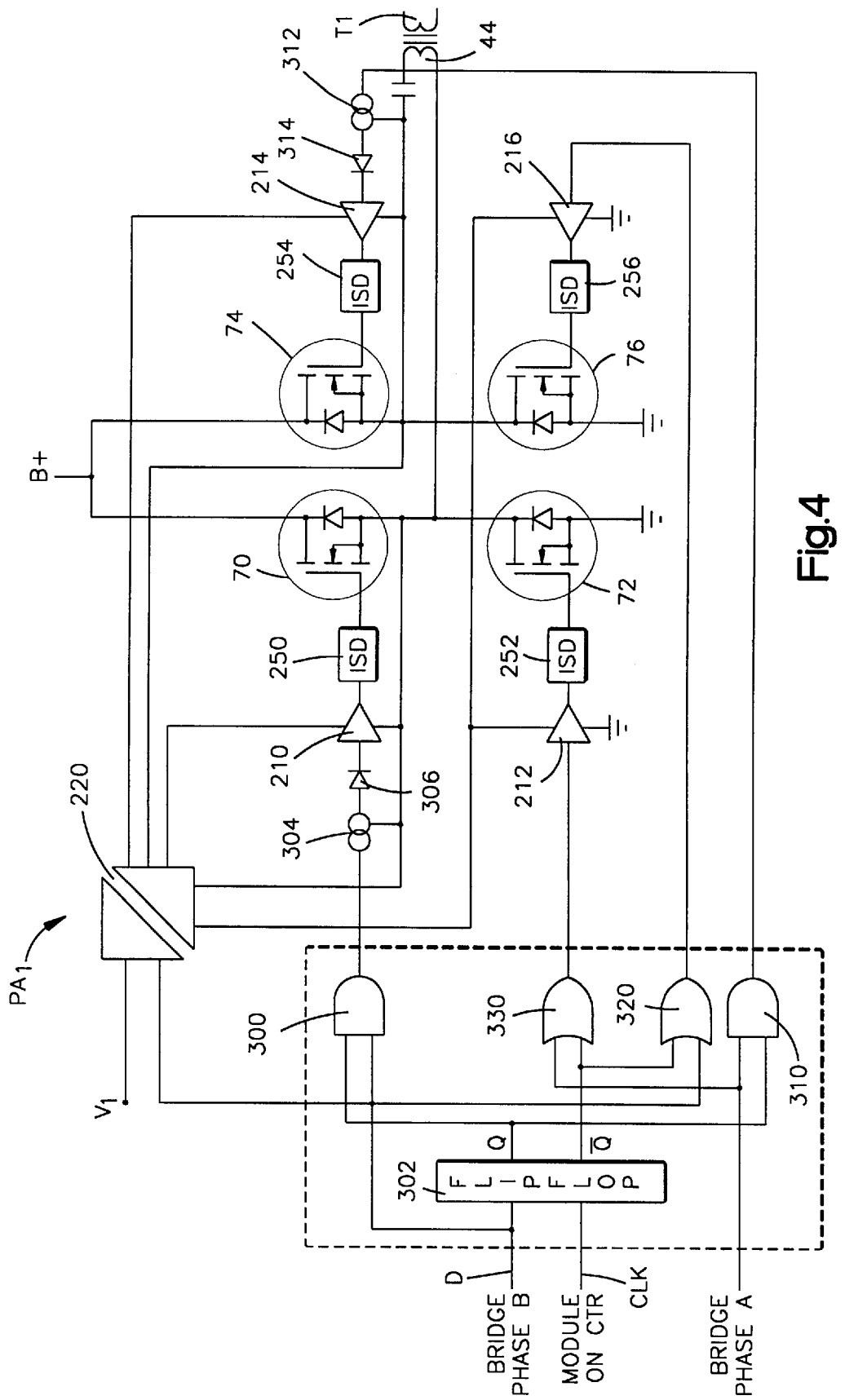
FIG. 4 is a schematic-block diagram illustration of a power amplifier incorporating circuitry in accordance with the preferred embodiment of the present invention.

Each of the power amplifiers $PA_1$–$PA_N$ in FIG. 3 takes the form of power amplifier $PA_1$ illustrated in greater detail in FIG. 4. In FIG. 4, the four MOSFET transistors 70, 72, 74 and 76 are illustrated in the same manner as that as shown in FIG. 2 with the drain electrodes of transistors 70 and 74 being connected to the B+ voltage supply source. A direct drive is obtained with the circuitry illustrated in FIG. 4 and wherein only logic level signals are employed and no bipolar signals are employed.

The drive circuits for the various MOSFET transistors 70, 72, 74 and 76 each include a MOSFET driver amplifier serving as a buffer amplifier and these include buffer amplifiers 210, 212, 214 and 216. Each is supplied with power from a synchronous isolated RF drive power supply (SIPS) 220. This power supply is a DC to DC power supply and provides low voltage outputs to operate the MOSFET buffer amplifiers and the DC supply voltage may exhibit a ripple voltage wherein the ripple is of the same frequency as the carrier frequency $F_c$ (as taken from the output of the RF oscillator 20' FIG. 3). The power supply 220 of FIG. 4 is illustrated in greater detail in FIG. 5 to which attention is now directed.

Figure 5:
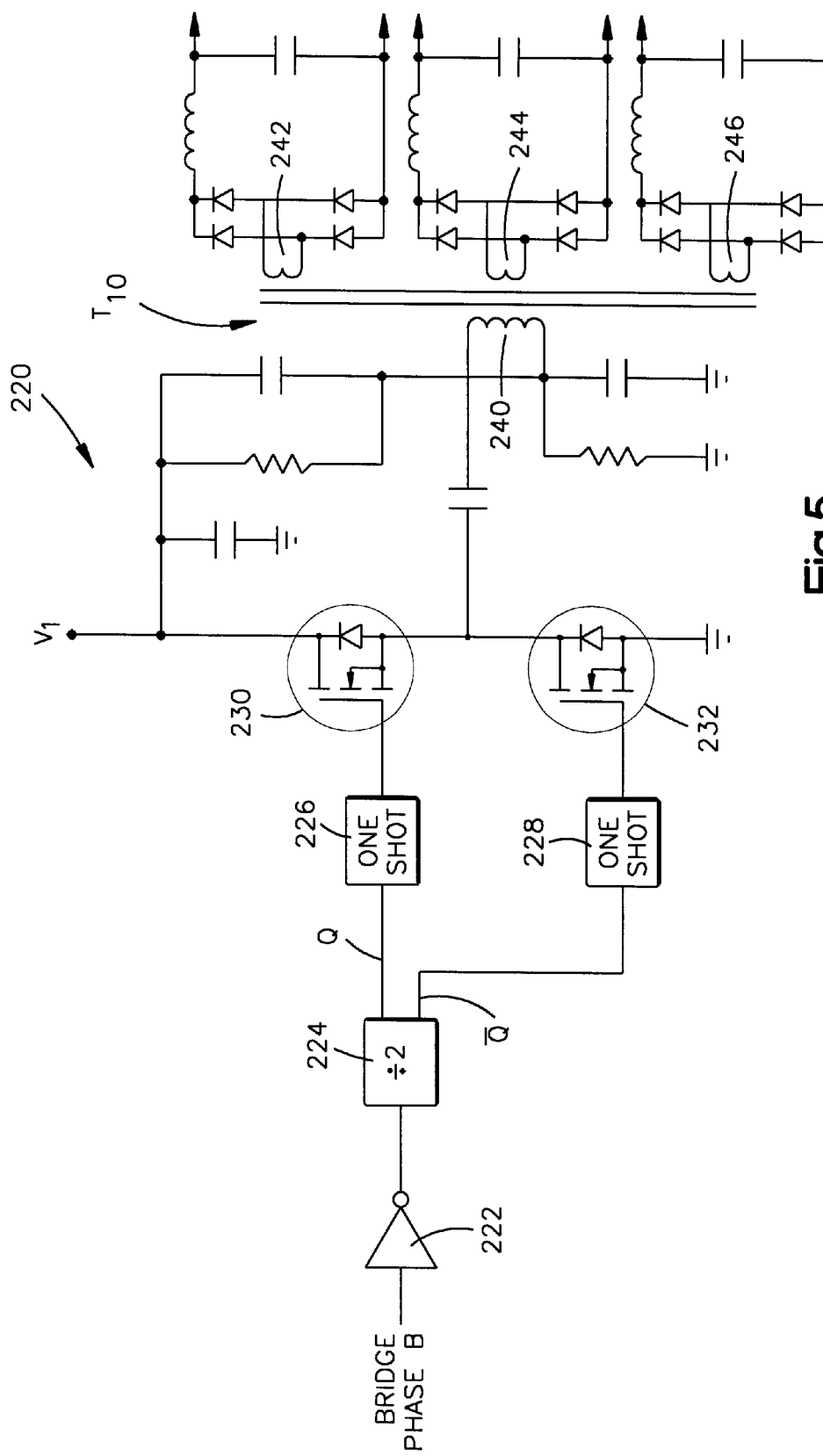
FIG. 5 is a schematic-block diagram illustration of an improved power supply.

In FIG. 5, the input signal at frequency $F_c$ is taken from the output of the one shot circuit 204 (FIG. 3) and is inverted by an inverter 222 with the square wave pulse train being supplied to a divide by two circuit 224 which may take the form of a flip flop having a Q and $\overline{Q}$ outputs. These outputs are 180 degrees out of phase and each exhibits a frequency of $F_c/2$. The pulses obtained from the Q output of divider circuit 224 are supplied to a one shot circuit 226 and those from the $\overline{Q}$ output are supplied to a one shot circuit 228. The output pulses obtained from the one shot circuits are 180 degrees out of phase with respect to each other and are respectively applied to the gates of MOSFET transistors 230 and 232. The pulses obtained from one shot circuits 226 and 228 are also provided with a deadband to ensure that transistors 230 and 232 are not turned on at the same time. These transistors are each connected in series with the primary winding 240 of a transformer T10 having a plurality of secondary windings 242, 244 and 246. When transistor 230 is on it connects the upper end of winding 240 to a DC source V1 whereas when transistor 232 is on it connects the upper end of the winding 240 to ground. As noted, each secondary winding is provided with a full wave diode bridge to produce a DC supply voltage for the associated MOSFET buffer amplifiers. The rectified DC voltage from secondary winding 244 is applied across the buffer amplifier 210 whereas that across secondary winding 246 is applied across buffer amplifier 214. These amplifiers are floating relative to ground. The full wave diode bridge connected across winding 242 is referenced to ground and consequently a single output taken from the upper end of this full wave diode bridge is supplied to the buffer amplifiers 212 and 216. This is a half bridge switching power supply that operates at one-half of the transmitter carrier frequency ($F_c/2$). The DC ripple voltage obtained from each of the three full wave diode bridge circuits on the secondary windings 242, 244 and 246 exhibits a ripple frequency equal to the amplifier carrier frequency ($F_c$) and therefore no intermodulation products will be created. If the power supply operates at a different frequency it would result in unwanted intermodulation products due to the mixing between the amplifier carrier frequency and the switching power supply frequency.

Figure 6:
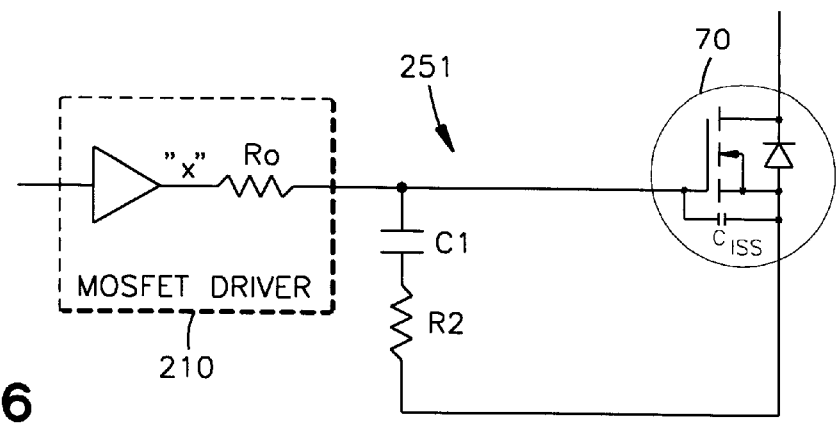
FIG. 6 is a schematic-block diagram of a prior art MOSFET drive circuit.

As noted in FIG. 4, an inductive steering drive (ISD) circuit is provided between each buffer amplifier and the associated MOSFET transistor. Thus, inductive steering drive circuits 250, 252, 254 and 256 are respectively located in the gate drive circuits of transistors 70, 72, 74 and 76. Each of these circuits takes the form of the inductive steering drive circuit 250 as illustrated in FIG. 6 to which attention is now directed. A typical MOSFET starts to turn-on at 2Vdc and is completely on at 4Vdc. The threshold for turn-off is going in the reverse direction, it starts to turn-off at 4Vdc and is completely off at 2Vdc.

In order to achieve the best efficiency as a class D amplifier, fast turn-off is essential. On the other hand, turn-on slope is not as important because during each turn-on cycle, the current through each MOSFET is zero and hence no dissipation. During turn-off, the current is still flowing through the bridge amplifier, interruption of the current can cause dissipation and low overall efficiency if the fall time is slower.

Figure 8:
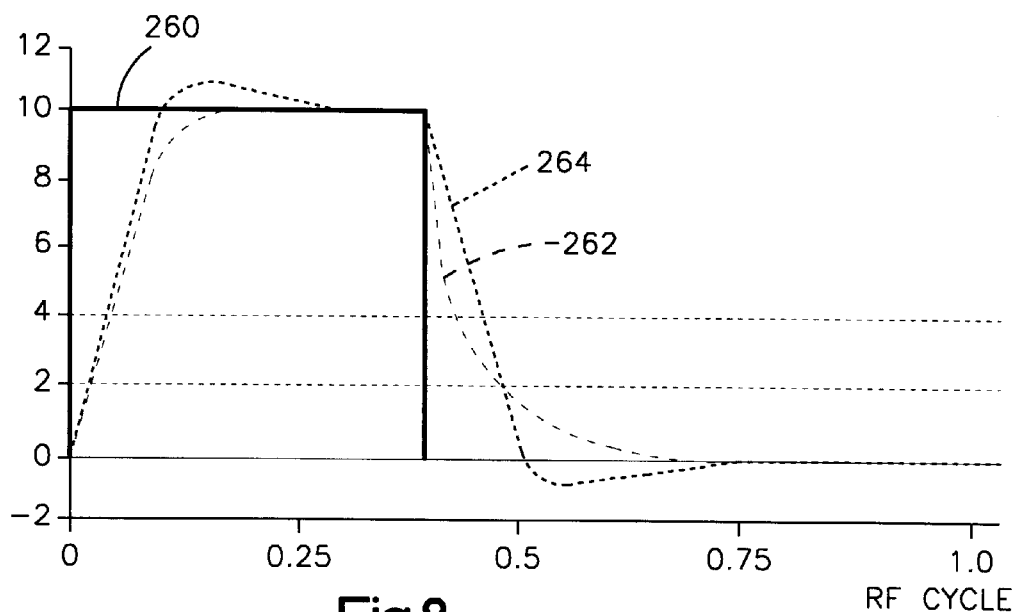
FIG. 8 is a graphical illustration of voltage amplitude with respect to time illustrating an RF drive waveform employing inductive steering; and, FIG. 9 is a plurality of waveforms illustrating the timing diagram for the amplifier herein with the waveforms being illustrated as amplitude with respect to time.

The input drive signal "x" is an ideal square-wave shown by waveform 260 in FIG. 8. The input capacitance of the MOSFET and the output impedance of the MOSFET driver limit the signal's rise and fall slopes.

To explain the drive function of the circuit, reference is made to the prior art circuit 251 of FIG. 6. The output impedance of the MOSFET driver is Ro and the input gate capacitance for the MOSFET 70 is Ciss is shown in FIG. 6. The standard driving circuit can be simplified as two-element circuit consists of Ro and Ciss, where the transient response waveform 262 is shown in FIG. 8, which has the characteristic of the log function. The rise time is relatively fast but the fall time is much slower with a trailing off slope, which increases MOSFET dissipation because the MOSFET current is not zero during switch off period from 4V to 2V.

Figure 7:
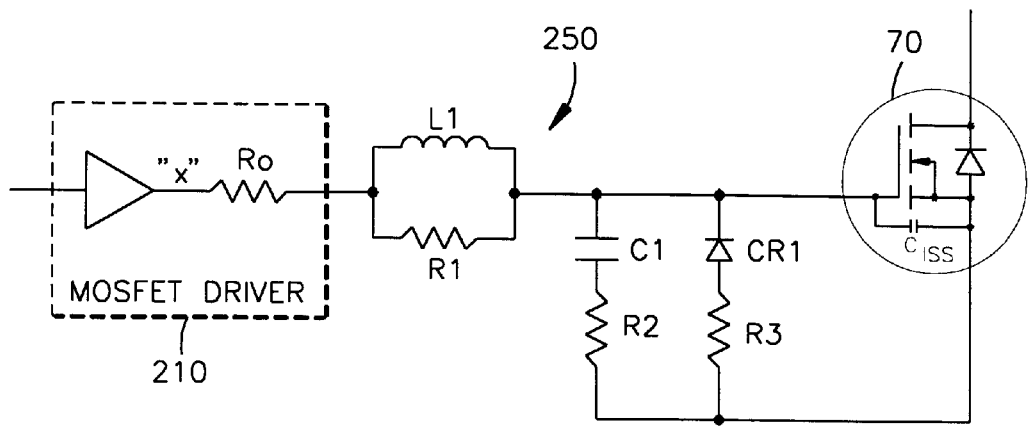
FIG. 7 is a schematic-circuit illustrating a an inductive steering drive circuit.

On the other hand, the ISD circuit 250 (FIG. 7) with added components L1, R1, CR1 and R3, has a trapezoidal drive signal with a linear rise and fall times as seen in waveform 264 in FIG. 8. As the input drive signal "x" goes from low to high, the voltage at the gate of the MOSFET is delayed allowing energy to store in the series inductor L1. Gate voltage waveform is then overshot by the energy returned from the inductor. Similar transient response under turn-off condition.

A correct inductor L1 value is when the slopes of the rise and fall times are maximized (highest dv/dt) to minimize any transition switching losses. Some overshot and undershoot are necessary to provide over damp transient characteristic to ensure a linear slope of rise and fall times. Snubber circuit including CR1 and R3 is only active if the negative undershoot is greater than the diode drop voltage of the CR1. These two components are transparent during the overshoot condition.

With such a fast fall time, the MOSFET dissipation is minimized and, hence, maximum output efficiency is achieved permitting this bridge amplifier to operate at very high frequencies suitable for use with digital radio operation. Using this inductive drive circuit, a diode snubbing circuit including capacitor C1, resistor R2, diode CR1 and resistor R3 is added to prevent any oscillation created by the series inductor in combination with the gate capacitance of the MOSFET. It is to be noted that this steering drive permits elimination of the RF drive tuning circuit including capacitor 102 and 104 (see FIG. 2).

A switch driver arrangement is provided for passing bridge phase B pulses or bridge phase A pulses to drive the MOSFET transistors such that transistors 70 and 76 are turned on as a pair by bridge phase B pulses and then turned off and transistors 72 and 74 are turned on as a pair by bridge phase A pulses. The phase B pulses are passed by a logic switch driver AND gate 300 when enabled from a Q output of a D type flip flop 302. Phase B pulses passed by AND gate 300 are applied to a pulse transformer. The output of the pulse transformer 304 is rectified by a diode 306 and then buffered by the buffer amplifier 210.

Similarly, a switch driver logic gate taking the form of AND gate 310, when enabled by flip-flop 302, passes the bridge phase A pulses to the gate of transistor 74 by way of a pulse transformer 312 and a diode 314 and buffered by buffer amplifier 214.

Whenever transistor 70 is turned on, a phase B pulse is also passed by an OR gate 320 to turn on transistor 76 by way of buffer amplifier 216 and the inductive steering drive circuit 256. Similarly, whenever transistor 74 is turned on, a phase A pulse is passed by an OR gate 330 and the buffer amplifier 212 and the inductive steering drive circuit 252 to the gate electrode of transistor 72 to turn this transistor on.

Reference is now made to the waveforms of FIG. 9 which provide a timing diagram for the operation of the power amplifier depicted in FIG. 4. The module turn on signal obtained from the D1 output of digitizer 16 is supplied to the clock CLK input of flip flop 302 in FIG. 4. This flip flop serves as a driver controller for providing turn on or enabling signals to enable AND gates 300 and 310 for purposes of passing the bridge phase B pulses and the bridge phase A pulses to drive transistors 70 and 74. As seen in FIG. 8, the Q output of flip flop 302 is raised providing a binary "1" signal upon the falling edge of the bridge phase B signal and this serves as an enabling signal to enable AND gates 300 and 310. Using flip flop 302 to synchronously control the amplifier ensures that the turn on and turn off of the amplifier takes place at the start and end of an RF cycle. The waveforms 400, 402, 404, 406, 408 and 410 of FIG. 9 show a timing diagram for the amplifier operating over two complete clock cycles. The amplifier output is synchronized to the Q and the $\bar{Q}$ outputs. This is an important factor to maintain reliable operation. If the switching timing is not synchronized, damage to the MOSFETs may occur and cause a high dv/dt secondary breakdown of the transistors.

The pulse transformers 304 and 312 provide isolated drive signals (bridge phase A and bridge phase B pulses) to the floating MOSFET transistors 70 and 74. The rectified RF drive signals from the secondary of pulse transformers T1 and T2 are buffered by the MOSFET drivers 210 and 214 to switch the floating transistors on and off to produce an amplified output signal.

Although the invention has been described in conjunction with a preferred embodiment, it is to be appreciated that various modifications may be made without departing from the spirit and scope of the invention as defined by the appended claims.

Having described the invention I claim:

1. A RF power amplifier system, comprising:
   a RF source for providing a train of RF pulses exhibiting RF cycles of a fixed frequency and wherein each pulse is of a fixed amplitude and duration;
   a DC voltage source;
   a bridge circuit including a first transistor switch for, when on, connecting said DC voltage source across said load for DC current flow therethrough in a first direction and a second transistor switch for, when on, connecting said DC voltage source across said load for DC current flow therethrough in a second direction;
   a switch driver for, when enabled, passing said RF pulses for driving said first and second transistor switches on and off at a frequency dependent upon that of said RF pulses and in such a manner that current from said DC voltage source alternately flows in said first and second directions through said load;
   a driver controller for providing turn-on signals and selectively applying them to said switch driver for enabling said switch driver for passing said RF pulses to said transistor switches;
   said switch driver including first and second logic gates respectively connected to said first and second transistor switches; and
   first and second inductive steering circuits respectively interposed between said first logic gate and said first transistor switch and said second logic gate and said second transistor switch.

2. A system as set forth in claim 1 wherein each said steering circuit includes an inductor.

3. A system as set forth in claim 1 wherein each said steering circuit includes a resistor and an inductor connected together in parallel.

4. A system as set forth in claim 1 wherein each said transistor switch is a MOSFET transistor having a gate electrode.

5. A system as set forth in claim 4 wherein each said steering circuit is interposed between a said logic gate and a said gate electrode.

6. A system as set forth in claim 5 wherein each said steering circuit includes an inductor.

7. A system as set forth in claim 5 wherein each said steering circuit includes a resistor and an inductor connected together in parallel.

8. A system as set forth in claim 7 including a snubber circuit connected between the gate electrode and the source electrode of each said MOSFET transistor.

9. A system as set forth in claim 8 wherein each said snubber circuit includes a first circuit having a capacitor and a second resistor connected together in series and a second circuit having a diode and a third resistor connected together in series with said first and second circuits being connected together in parallel.

10. A system as set forth in claim 1 including logic circuitry responsive to an amplifier turn-on control signal and said RF pulses for enabling said switch driver in such a manner that the first and second transistor switches are turned on and off in synchronism with the start of a said RF cycle and the end of a said RF cycle.

11. A system as set forth in claim 10 wherein each said steering circuit includes an inductor.

12. A system as set forth in claim 10 wherein each said steering circuit includes a resistor and an inductor connected together in parallel.

13. A system as set forth in claim 10 wherein each said transistor switch is a MOSFET transistor having a gate electrode.

14. A system as set forth in claim 13 wherein each said steering circuit is interposed between said logic gate and said gate electrode.

15. A system as set forth in claim 14 wherein each said steering circuit includes an inductor.

16. A system as set forth in claim 14 wherein each said steering circuit includes a resistor and an inductor connected together in parallel.

17. A system as set forth in claim 16 including a snubber circuit connected between the gate electrode and the source electrode of each said MOSFET transistor.

18. A system as set forth in claim 17 wherein each said snubber circuit includes a first circuit having a capacitor and a second resistor connected together in series and a second circuit having a diode and a third resistor connected together in series with said first and second circuits being connected together in parallel.

19. A system as set forth in claim 1 including a driver amplifier interposed between said switch driver and each said transistor switch in said bridge circuit;

a DC to DC power supply for supplying DC drive voltage to each said driver amplifier wherein said power supply includes a second DC voltage source, a transformer having a primary winding and a plurality of secondary windings, a first switching transistor for, when on, connecting said primary winding across said second DC voltage source, and a control circuit for turning said first switching transistor on and off in synchronism with the frequency of said RF pulses so that any DC supply ripple voltage at said secondary windings has a ripple frequency equal to the frequency of said RF pulses.

20. A system as set forth in claim 19 wherein each said steering circuit includes an inductor.

21. A system as set forth in claim 19 wherein each said steering circuit includes a resistor and an inductor connected together in parallel.

22. A system as set forth in claim 19 wherein each said transistor switch is a MOSFET transistor having a gate electrode.

23. A system as set forth in claim 22 wherein each said steering circuit is interposed between said logic gate and said gate electrode.

24. A system as set forth in claim 23 wherein each said steering circuit includes an inductor.

25. A system as set forth in claim 23 wherein each said steering circuit includes a resistor and an inductor connected together in parallel.

26. A system as set forth in claim 25 including a snubber circuit connected between the gate electrode and the source electrode of each said MOSFET transistor.

27. A system as set forth in claim 26 wherein each said snubber circuit includes a first circuit having a capacitor and a second resistor connected together in series and a second circuit having a diode and a third resistor connected together in series with said first and second circuits being connected together in parallel.

28. A system as set forth in claim 19 wherein said driver controller includes logic circuitry responsive to an amplifier turn on control signal and said RF pulses for enabling said switch driver in such a manner that the first and second transistor switches are turned on and off in synchronism with the start of a said RF cycle and the end of a said RF cycle.

29. A system as set forth in claim 28 wherein each said steering circuit includes an inductor.

30. A system as set forth in claim 28 wherein each said steering circuit includes a resistor and an inductor connected together in parallel.

31. A system as set forth in claim 28 wherein each said transistor switch is a MOSFET transistor having a gate electrode.

32. A system as set forth in claim 31 wherein each said steering circuit is interposed between said logic gate and said gate electrode.

33. A system as set forth in claim 32 wherein each said steering circuit includes an inductor.

34. A system as set forth in claim 32 wherein each said steering circuit includes a resistor and an inductor connected together in parallel.

35. A system as set forth in claim 34 including a snubber circuit connected between the gate electrode and the source electrode of each said MOSFET transistor.

36. A system as set forth in claim 35 wherein each said snubber circuit includes a first circuit having a capacitor and a second resistor connected together in series and a second circuit having a diode and a third resistor connected together in series with said first and second circuits being connected together in parallel.

37. A RF power amplifier system, comprising:

a RF source for providing a train of RF pulses;

a first transistor switch for, when on, connecting a DC voltage source across a load for DC current flow therethrough in a first direction;

a switch driver for passing said RF pulses for driving said transistor switch on and off at a frequency dependent upon that of said RF pulses;

a driver controller for providing turn-on signals and applying them to said switch driver for enabling said switch driver for passing said RF pulses to said transistor switch;

said switch driver including a first logic gate connected to said first transistor switch; and a first inductive steering circuit interposed between said first logic gate and said first transistor switch such that each said RF pulse applied to said first transistor switch exhibits a fast trailing edge to obtain a fast turn off of said transistor switch.

38. A system as set forth in claim 37 wherein said steering circuit includes an inductor.

39. A system as set forth in claim 37 wherein said steering circuit includes a resistor and an inductor connected together in parallel.

40. A system as set forth in claim 37 wherein said transistor switch is a MOSFET transistor having a gate electrode.

41. A system as set forth in claim 40 wherein said steering circuit is interposed between said logic gate and said gate electrode.

42. A system as set forth in claim 41 wherein said steering circuit includes an inductor.

43. A system as set forth in claim 41 wherein said steering circuit includes a resistor and an inductor connected together in parallel.

44. A system as set forth in claim 43 including a snubber circuit connected between the gate electrode and the source electrode of said MOSFET transistor.

45. A system as set forth in claim 44 wherein said snubber circuit includes a first circuit having a capacitor and a second resistor connected together in series and a second circuit having a diode and a third resistor connected together in series with said first and second circuits being connected together in parallel.

46. A system as set forth in claim 37 including a second transistor switch for, when on, connecting said DC voltage source across said load for DC current flow therethrough in a second direction; and logic circuitry responsive to an amplifier turn-on control signal and said RF pulses for enabling said switch driver in such a manner that the first and second transistor switches are turned on and off in synchronism with the start of a said RF cycle and the end of a said RF cycle.

47. A system as set forth in claim 46 wherein said steering circuit includes an inductor.

48. A system as set forth in claim 46 wherein said steering circuit includes a resistor and an inductor connected together in parallel.

49. A system as set forth in claim 46 wherein said transistor switch is a MOSFET transistor having a gate electrode.

50. A system as set forth in claim 49 wherein said steering circuit is interposed between said logic gate and said gate electrode.

51. A system as set forth in claim 50 wherein said steering circuit includes an inductor.

52. A system as set forth in claim 50 wherein said steering circuit includes a resistor and an inductor connected together in parallel.

53. A system as set forth in claim 52 including a snubber circuit connected between the gate electrode and the source electrode of said MOSFET transistor.

54. A system as set forth in claim 53 wherein each said snubber circuit includes a first circuit having a capacitor and a second resistor connected together in series and a second circuit having a diode and a third resistor connected together in series with said first and second circuits being connected together in parallel.

55. A system as set forth in claim 37 including a driver amplifier interposed between said switch driver and said transistor switch;

a DC to DC power supply for supplying DC drive voltage to said driver amplifier wherein said power supply includes a second DC voltage source, a transformer having a primary winding and at least one secondary winding, a first switching transistor for, when on, connecting said primary winding across said second DC voltage source, and a control circuit for turning said first switching transistor on and off in synchronism with the frequency of said RF pulses so that any DC supply ripple voltage at said secondary winding has a ripple frequency equal to the frequency of said RF pulses.

56. A system as set forth in claim 55 wherein said steering circuit includes an inductor.

57. A system as set forth in claim 55 wherein said steering circuit includes a resistor and an inductor connected together in parallel.

58. A system as set forth in claim 55 wherein said transistor switch is a MOSFET transistor having a gate electrode.

59. A system as set forth in claim 58 wherein said steering circuit is interposed between said logic gate and said gate electrode.

60. A system as set forth in claim 59 wherein said steering circuit includes an inductor.

61. A system as set forth in claim 59 wherein said steering circuit includes a resistor and an inductor connected together in parallel.

62. A system as set forth in claim 61 including a snubber circuit connected between the gate electrode and the source electrode of said MOSFET transistor.

63. A system as set forth in claim 62 wherein said snubber circuit includes a first circuit having a capacitor and a second resistor connected together in series and a second circuit having a diode and a third resistor connected together in series with said first and second circuits being connected together in parallel.

64. A system as set forth in claim 55 wherein said driver controller includes logic circuitry responsive to an amplifier turn on control signal and said RF pulses for enabling said switch driver in such a manner that the first transistor switch is turned on and off in synchronism with the start of a said RF cycle and the end of a said RF cycle.

65. A system as set forth in claim 64 wherein said steering circuit includes an inductor.

66. A system as set forth in claim 64 wherein said steering circuit includes a resistor and an inductor connected together in parallel.

67. A system as set forth in claim 64 wherein said transistor switch is a MOSFET transistor having a gate electrode.

68. A system as set forth in claim 67 wherein said steering circuit is interposed between said logic gate and said gate electrode.

69. A system as set forth in claim 68 wherein said steering circuit includes an inductor.

70. A system as set forth in claim 68 wherein said steering circuit includes a resistor and an inductor connected together in parallel.

71. A system as set forth in claim 70 including a snubber circuit connected between the gate electrode and the source electrode of said MOSFET transistor.

72. A system as set forth in claim 71 wherein said snubber circuit includes a first circuit having a capacitor and a second resistor connected together in series and a second circuit having a diode and a third resistor connected together in series with said first and second circuits being connected together in parallel.

* * * * *